United States Patent [19]

Ullmann et al.

[11] Patent Number: 4,661,999
[45] Date of Patent: Apr. 28, 1987

[54] MICROWAVE PUSH-PULL FREQUENCY CONVERTER

[75] Inventors: Wolfgang Ullmann, Backnang; Walter Gross, Auenwald, both of Fed. Rep. of Germany

[73] Assignee: ANT Nachrichtentechnik GmbH, Backnang, Fed. Rep. of Germany

[21] Appl. No.: 673,999

[22] Filed: Nov. 21, 1984

[30] Foreign Application Priority Data

Nov. 24, 1983 [DE] Fed. Rep. of Germany ....... 3342400

[51] Int. Cl.⁴ .............................................. H04B 1/26
[52] U.S. Cl. ................................... 455/328; 455/330; 455/332; 333/208; 333/211; 333/212
[58] Field of Search ............... 455/325, 328, 330, 332; 333/208, 211, 212, 21 R

[56] References Cited

U.S. PATENT DOCUMENTS

| | | | |
|---|---|---|---|
| 3,638,126 | 1/1972 | Spacek | 455/328 |
| 3,949,327 | 4/1976 | Chapell | 333/208 |
| 4,348,773 | 9/1982 | Caroli | 455/330 |
| 4,471,313 | 9/1984 | Ohm et al. | 329/112 |

OTHER PUBLICATIONS

"Frequenzumsetzer Für Fernseh-Rundfunk-Satelliten" by Ullmann, 1980.

IEEE Transaction on Microwave Theory and Techniques, vol. MTT-19, No. 3, 3/1971, pp. 295-308.

Primary Examiner—Benedict V. Safourek
Assistant Examiner—Elissa Seidenglanz
Attorney, Agent, or Firm—Spencer & Frank

[57] ABSTRACT

In a microwave push-pull frequency converter having the form of a waveguide for effecting frequency conversion of a broadband microwave signal, which converter includes a converter module composed of a waveguide section and a pair of semiconductor mixer elements disposed in the waveguide section for effecting frequency conversion between a high frequency microwave signal and a low frequency microwave signal without intermediate frequency conversion, the converter further including a waveguide filter for the low frequency microwave signal connected to one side of the module, the waveguide filter includes a plurality of ridged waveguide sections and a plurality of blocking waveguide sections interposed between, and coupling, the ridged waveguide sections, and the converter module includes fastening devices supporting the semiconductor mixer elements and configured to give the coverter module the form of a ridged waveguide which permits the high and low frequency microwave signals to pass in a single mode.

7 Claims, 9 Drawing Figures

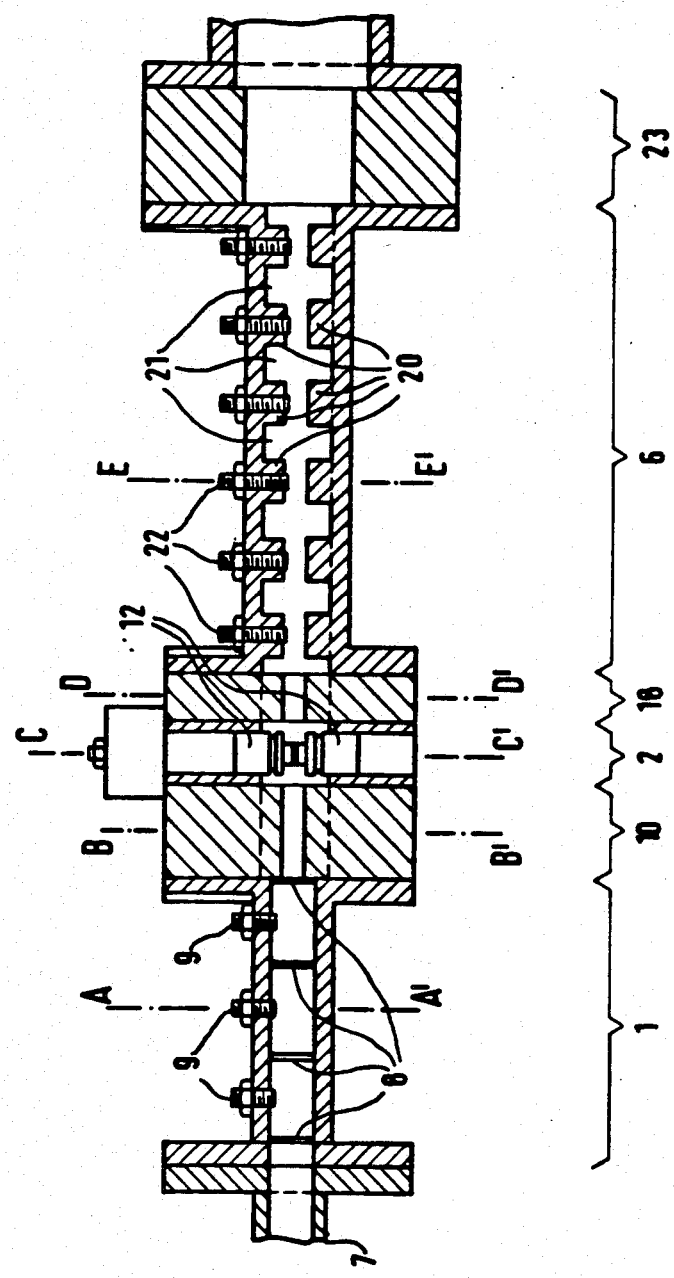

MICROWAVE PUSH-PULL FREQUENCY CONVERTER

BACKGROUND OF THE INVENTION

The present invention relates to a microwave push-pull frequency converter of the type described in the Special Reprint from NTZ, Volume 33 (1980), No. 9, pages 590-591.

Low-loss direct converters for television/radio satellites are designed using waveguide techniques. Such a converter converts, for example, five frequency modulated received signals within a 19 GHz band having a width of 400 MHz directly to a transmitted signal of 12 GHz. Other possible frequency combinations for such direct conversion are, for example, 6 to 4, 14 to 4, 14 to 12, 30 to 4, 30 to 20 and 30 to 12 GHz. For spacecraft, semiconductor converters must meet very high demands with respect to undesirable conversion products. They are therefore equipped with input and output filters.

High power undesirable conversion products may be reflected by the filters toward the semiconductor converter elements and may be reconverted and thus contribute to improvement of conversion losses, if reflected in the correct phase. In addition of these positive characteristics, such filters also have negative characteristics. The conversion results in a transmission characteristic with much interference and errors occur in matching. With increasing bandwidth, these secondary effects of the filters become more and more noticeable. For a converter whose input and output frequencies are very far apart, for example 30/12 GHz, filters must be provided which exhibit the lowest possible insertion loss and a very wide blocking range. In the reprint from NTZ, volume 33, (1980) No. 9, pages 590-591, it is proposed to provide a so-called 37 Evanescent Mode Filter" on the low frequency side of the converter. According to IEEE Transactions on Microwave Theory and Techniques, Volume MTT-19, No. 3, March, 1971, pages 295-308, particularly page 302, such asn evanescent mode filter exhibits a parasitic bandpass behavior. It is therefore only conditionally usable in connection with particularly broadband converters.

SUMMARY OF THE INVENTION

It is an object of the present invention to provide a microwave push-pull frequency converter with a waveguide type structure whose input and output frequencies lie relatively far apart, particularly at a ratio exceeding 1.5, and which exhibits a favorable behavior with respect to insertion loss and suppressions of conversion products.

The above and other objects are achieved, according to the invention, by improvements in a microwave push-pull frequency converter having the form of a waveguide for effecting frequency conversion of a broadband microwave signal, which converter includes a converter module composed of a waveguide section and a pair of semiconductor mixer elements disposed in the waveguide section for effecting frequency conversion between a high frequency microwave signal and a low frequency microwave signal directly without any intervening frequency conversion, the converter further including a waveguide filter for the low frequency microwave signal connected to one side of the module. According to the invention, the waveguide filter comprises a plurality of ridged waveguide sections and a plurality of blocking waveguide sections interposed between, and coupling, the ridged waveguide sections, and the converter module comprises fastening devices supporting the semiconductor mixer elements and configured to give the converter module the form of a ridged waveguide which permits the high and low frequency microwave signals to pass in a single mode.

With the special configuration of the waveguide filter for the low frequency microwave signal, good lowpass filtering behavior can be realized. In contradistinction to the evanescent mode filter, the equivalent circuit of this filter has essentialy only transverse capacitances and longitudinal inductances. If the filter impedance is selected to be relatively low, no additional transformation is required to couple the filter to the ridged waveguide leading to the converter module. Moreover, the selection of the lowpass impedance (about 80 Ohms) and the insertion of tuning screws in the ridges results in a shorter structural length.

The converter module according to the invention permits microwave signals at high and low frequency to pass in a single mode, e.g. the $H_{10}$ mode. The converter according to the present invention is qualified for space travel.

BRIEF DESCRIPTION OF THE DRAWING

A preferred embodiment of a converter according to the invention will now be described in greater detail with reference to the drawings.

FIG. 2 is a longitudinal cross-sectional view of the converter.

DESCRIPTION OF THE PREFERRED EMBODIMENTS

Figure 1:
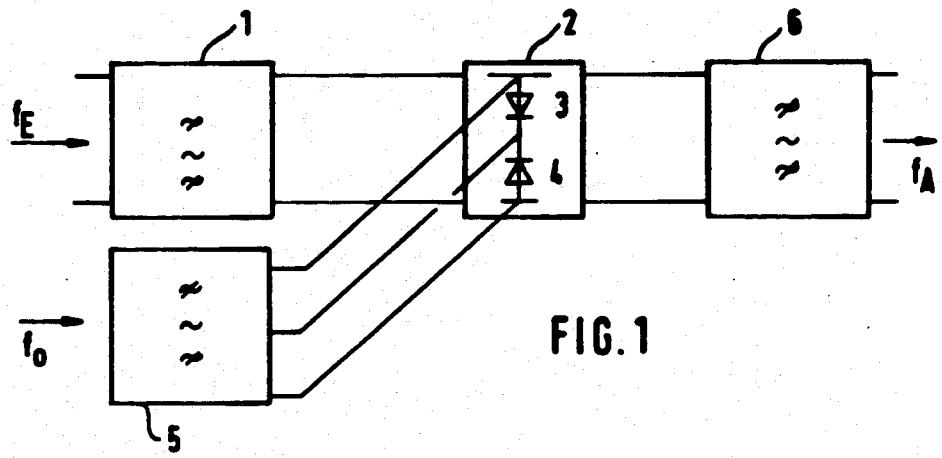
FIG. 1 is a block circuit diagram of the converter.

FIG. 1 shows the block circuit diagram of a microwave push-pull frequency converter in the form of a down converter. A 30 GHz input signal $f_E$, i.e. a microwave signal at high frequency, having a bandwidth of, for example, 400 MHz, is conducted through a bandpass filter 1 whose passband is adjusted to this high frequency microwave signal to a converter module 2.

The converter module 2 is composed of two semiconductor converter elements 3 and 4, for example GaAs Schottky diodes connected for push-pull operation. Semiconductor converter elements 3 and 4 receive an oscillator signal at frequency $f_0$ via a bandpass oscillator filter 5.

The oscillator frequency $f_0$ is selected with respect to input frequency $f_E$ so that a frequency conversion to 12 GHz takes place. The resulting 12 GHz signal $f_A$, i.e. the low frequency microwave signal, is freed of undesirable conversion products by means of a further bandpass filter 6. As will be described in detail below, filter 6 is composed of ridged waveguide sections exhibiting capacitive behavior and coupled together by means of blocking waveguide sections.

Figure 3:
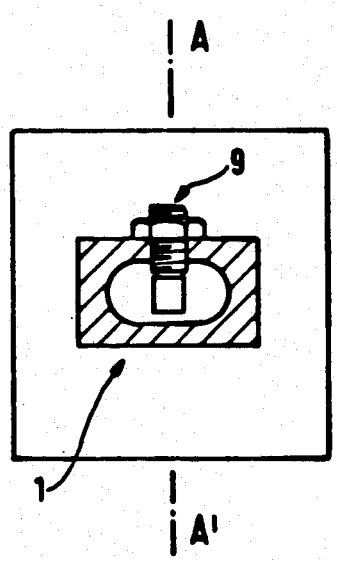
FIG. 3 is a cross-sectional view of the filter component for high frequency signals, along line A—A' of FIG. 1.

The cross-sectional view of FIG. 2 shows details of the converter structure. A waveguide connecting piece 7 for a 30 GHz signal has its output connected with filter 1. Filter 1 is composed of a three-circuit 3 λ/2-Tschebyscheff band filter in rectangular waveguide form for the $H_{10}$ mode. Coupling is effected by means of symmetrical inductive apertures 8 known in the art, e.g. Matthaei/Young/Jones, "Microwave Filters, . . .", page 463, FIG. 8.07-3, McGraw-Hill Book Company 1964, Library of Congress Catalogue Card Number 64-7937. Three capacitive tuning pins 9 are provided for tuning and are each centered electrically at a voltage maximum between two apertures 8. These tuning pins 9 are composed of simple tuning screws inserted into the upper wide side of the waveguide, see the cross-sectional view of FIG. 3, and are provided to compensate mechanical tolerances of waveguide section 1. The dipping-depth of tuning pins 9 depends only on these mechanical tolerances. For manufacturing reasons, the corners at the inside of waveguide filter 1 are rounded considerably, i.e. the waveguide interior cross section is quasi elliptical.

Figure 4:
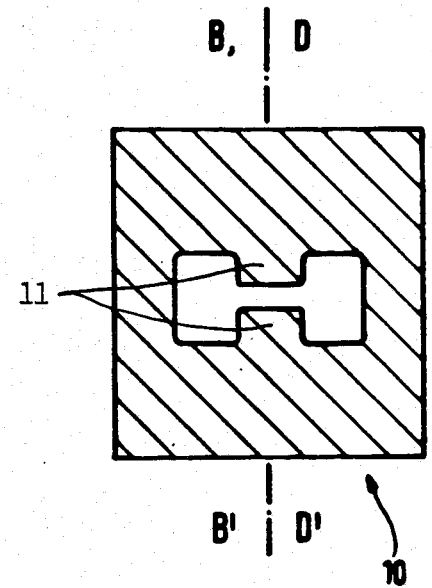
FIG. 4 is a cross-sectional view of a ridged waveguide connecting member between converter module and filter for high frequency signals, along lines B—B' and D—D' of FIG. 1.

Filter 1 for the 30 GHz signal is followed by a ridged waveguide piece 10 which establishes the connection between filter 1 and converter module 2. Ridged waveguide piece 10 is shown in section in FIG. 4. The two ridges 11 are centered on the wide sides of the rectangular waveguide for the $H_{10}$ mode. The output impedance of filter 1 at 12 GHz is to be transformed by ridged waveguide piece 10 disposed between converter module 2 and filter 1 into the plane of the semiconductor converter elements 3 and 4 so that in this plane the 12 GHz signal will idle. The length of ridged waveguide piece 10 corresponds approximately to $\lambda_H/8$, i.e. approximately 6 mm for a 30 GHz signal frequency, with the precise length depending on the output impedance of filter 1 for the 12 GHz signal.

Figure 5:
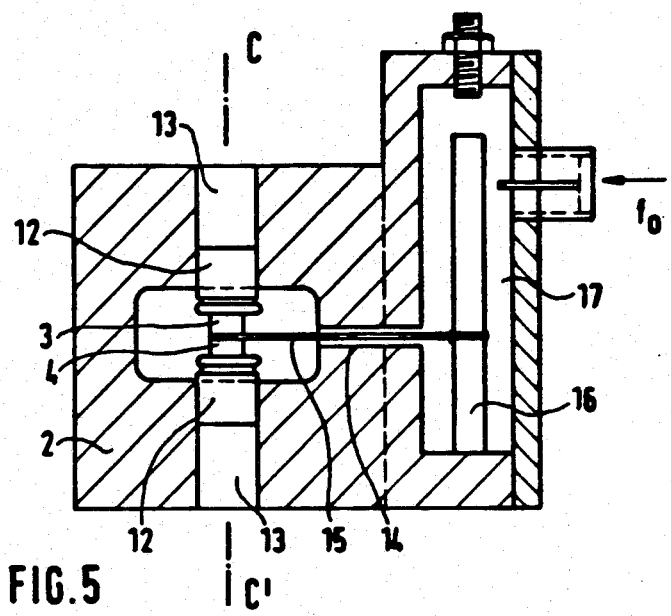
FIG. 5 is a cross-sectional view of the converter module, along line C—C' of FIG. 1.

Converter module 2 is designed as a three-port, with two ports, the input for the 30 GHz signal and the output for the 12 GHz signal and the third port for the input of the oscillator signal at frequency $f_0$ being in coaxial form. The output for the 12 GHz signal is connected to converter module 2 by ridged waveguide piece 18 and the input for the 30 GHz signal by ridged waveguide piece 10. Converter module 2 accommodates two superposed, series opposing semiconductor converter elements 3 and 4—GaAs Schottky diodes—in micropill housings. The ends of diodes 3 and 4 facing away from one another are fixed by means of fastening devices, e.g. gold bellows 12. Gold bellows 12 are inserted, as shown in FIG. 5, into the converter module housing through bores 13 and are soldered in there. Gold bellows 12, as well as the end faces of diodes 3 and 4 project into the interior of the waveguide of converter module 2 to such as extent that the gold bellows 12 as well as the metallic end faces of diodes 3 and 4 form ridges, see FIGS. 2 and 5, which give the converter module 2 the shape of a ridged waveguide. In order to avoid impedance steps, the shape of the ridges of converter module 2 must approximately coincide with the shape of the ridges of ridged waveguide member 10. As the bulk of diodes 3 and 4 is of ceramic material the diodes are not part of the ridges. Ridges are only formed by gold bellows 12. As for diodes 3 and 4 type DMK 4058 AM of Alpha Industries is suitable. Gold bellows 12 have the same diameter as have the broadsides of ridges 11 in waveguide piece 10. The dip-in depth of gold bellows 12 corresponds to the dip-in depth of ridged waveguide sections 20, thus forming a vertical spacing of approximately 2 mm between two opposite gold bellows 12.

The oscillator signal at frequency $f_0$ is supplied to diodes 3 and 4 in a conductive manner. For this purpose, a bore 14 is provided at one narrow waveguide side of converter module 2, see FIG. 5, through which projects an internal conductor 15. One end of internal conductor 15 is connected to, and between, the mutually facing ends of diodes 3 and 4. The other end of internal conductor 15 is connected to the internal conductor 16 of a coaxial cavity resonator 17, which is a capacitively shorted λ resonator. Such capacitively shortened resonators are known in the art, e.g. NTZ (Magazine of "Communications techniques"), Volume 33 (1980), No. 9, pages 590 and 591. The oscillator signal at frequency $f_0$ is coupled into the side of this cavity resonator 17. Cavity resonator 17 serves as filter 5 for oscillator frequency $f_0$. By means of the signal at frequency $f_0$, the 30 GHz microwave signal is converted to the 12 GHz range of the low frequency microwave signal.

Figure 6:
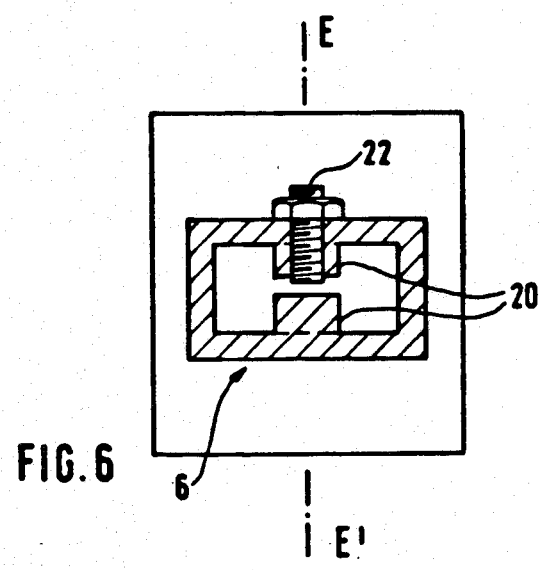
FIG. 6 is a cross-sectional view of the filter component for low frequency signals, along line E—E' of FIG. 1.

Converter module 2 in ridged waveguide form is followed at the port for the low frequency microwave signal again by a ridged waveguide piece 18 which establishes the connection between filter 6 for the low frequency microwave signal and converter module 2. The cross section of ridged waveguide piece 18 corresponds to the cross section of ridged waveguide piece 10. The input impedance of the 12 GHz filter 6 is to be transformed into the diode plane between converter module 2 and 12 GHz filter 6 by means of ridged waveguide piece 18 so that here the 30 GHz signal begins to idle. The length of ridged waveguide piece 18 is about $\lambda_H/4$. For 30 GHz this is about 4,5 mm. The precise length depends on the input impedance, for the 30 GHz signal, of the subsequent filter 6. If filters 1 and 6 are changed, e.g., if the bandwidth or the coupling is changed, the "outer band impedances" which are decisive for the length of the ridged waveguide pieces 10 and 18 also change. The subsequent filter 6 for the low frequency microwave signal is composed of ridged waveguide sections 20 coupled together by blocking waveguide sections 21, i.e. cut-off waveguides. Ridged waveguide sections 20 can be tuned by means of tuning pins 22. These tuning pins 22 are composed of simple tuning screws, as shown particularly in the sectional view of FIG. 6. Tuning pins 22 are provided to compensate mechanical tolerances of waveguide section 21 as do tuning pins 9. They are inserted each time from the top in the center of the wide side of the resonator.

Figure 7:
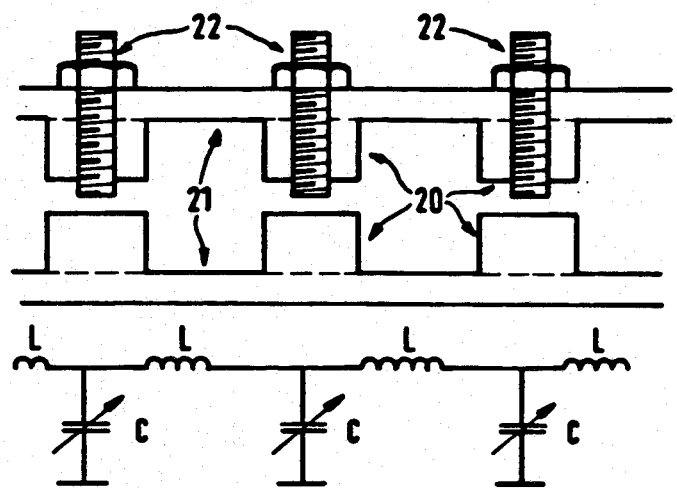
FIG. 7 is an elevational detail view and an equivalent circuit diagram of the filter component for low frequency signals.

FIG. 7 shows the equivalent circuit for filter 6. The ridged waveguide sections 20 with tuning screws 22 constitute tunable transverse capacitances C. Waveguide sections 21 constitute longitudinal inductances. L.

Figure 8:
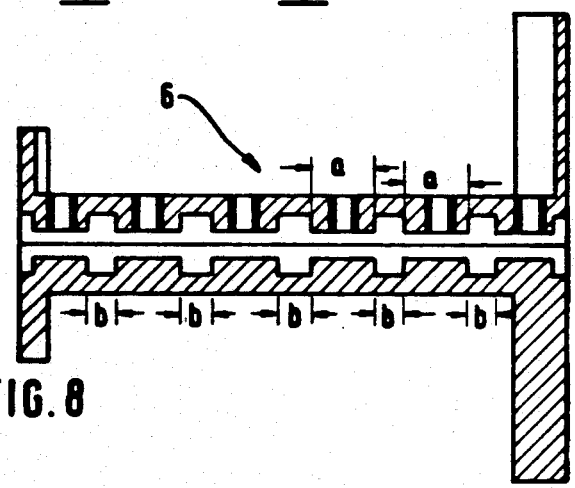
FIG. 8 is a longitudinal cross-sectional view, to scale, of the filter component for low frequency signals.

As can be seen in FIG. 8, all of the ridged waveguide sections 20 have the same length a=5 mm. However, blocking waveguide sections 12 vary in length b between 2 and 2,5 mm. At the ends of filter 6, lengths b are shortest and in the center of the filter, they are longest.

Figure 9:
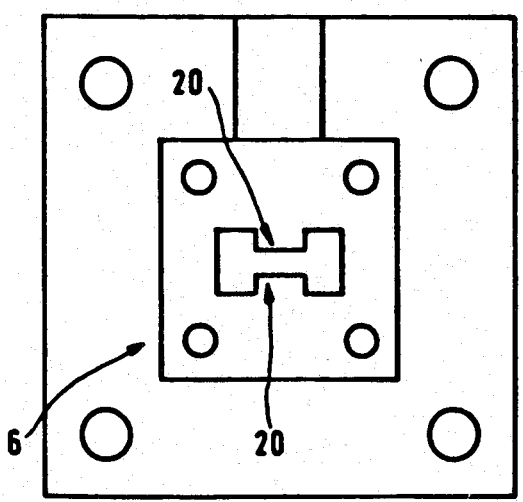
FIG. 9 is a front end view of the filter component of FIGS. 6 to 8.

As shown in FIG. 9, the ridges of sections 20 have a horizontal width of 4 mm, a height of 3 mm, and a vertical spacing of 2 mm. A single or multiple stage $\lambda/4$ waveguide transformer 23 is disposed at the end of filter 6 remote from the converter module. All tuning pins are composed of tuning screws with a diameter of 3 mm.

It will be understood that the above description of the present invention is susceptible to various modifications, changes and adaptations, and the same are intended to be comprehended within the meaning and range of equivalents of the appended claims.

What is claimed is:

1. In a microwave push-pull frequency converter having the form of a waveguide for converting the frequency of a broadband microwave signal between a high frequency level and a low frequency level, which converter includes a converter module having first and second ends and composed of a waveguide section extending between the ends and a pair of semiconductor mixer elements disposed in the waveguide section for effecting frequency conversion of the microwave signal between the high frequency level and the low frequency level directly without any intervening frequency conversion, the converter further including a waveguide filter for the low frequency level microwave signal connected to the second end of the module and an input waveguide coupled to the first end of the module for coupling the high frequency level microwave signal to the mixer elements, the improvement wherein: said waveguide filter comprises a plurality of ridged waveguide sections and a plurality of blocking waveguide sections interposed between, and coupling, said ridged waveguide sections; and said converter module comprises fastening devices supporting said semiconductor mixer elements and configured to give said converter module the form of a ridged waveguide which permits the high and low frequency level microwave signals to pass in a single mode.

2. Microwave push-pull frequency converter as defined in claim 1, wherein each said ridged waveguide section comprises a tuning pin.

3. Microwave push-pull frequency converter as defined in claim 2, wherein said waveguide filter for the low frequency level signal is given a low impedance.

4. Microwave push-pull frequency converter as defined in claim 3 further comprising a waveguide transformer connected to the end of said waveguide filter which is remote from said converter module.

5. Microwave push-pull frequency converter as defined in claim 4 further comprising a ridged waveguide piece connected between said converter module and said waveguide filter for the low frequency level microwave signal, said ridged waveguide piece having substantially the same cross section as the ridged waveguide formed by said converter module and having such dimensions that the input impedance of said waveguide filter for high frequency level signals is transformed into the plane of said semiconductor mixer elements.

6. Microwave push-pull frequency converter as defined in claim 5 wherein said input waveguide comprises a second waveguide filter for the high frequency level microwave signal, and a second ridged waveguide piece connected between the other side of said converter module and said second waveguide filter, said second ridged waveguide piece having substantially the same cross section as the ridged waveguide formed by said converter module and having such dimensions that the output impedance of said second waveguide filter for low frequency level signals is transformed into the plane of said semiconductor mixer elements.

7. Microwave push-pull frequency converter as defined in claim 1 wherein said input waveguide, said waveguide section and said waveguide filter are arranged in line with one another.

* * * * *